US005177500A

United States Patent [19]

Ng

[11] Patent Number: 5,177,500

[45] Date of Patent: Jan. 5, 1993

[54] LED ARRAY PRINTHEAD WITH THERMALLY COUPLED ARRAYS

[75] Inventor: Yee S. Ng, Fairport, N.Y.

[73] Assignee: Eastman Kodak Company, Rochester, N.Y.

[21] Appl. No.: 757,769

[22] Filed: Sep. 11, 1991

[51] Int. Cl.[5] ....................... G01D 15/14; H02G 5/10; H01L 33/00

[52] U.S. Cl. ................................ 346/107 R; 361/428; 257/88

[58] Field of Search ............... 346/107 R; 357/28, 81, 357/75, 17; 361/386, 388, 389, 428

[56] References Cited

U.S. PATENT DOCUMENTS

| | | | |
|---|---|---|---|
| 4,807,047 | 2/1989 | Sato et al. | 346/107 R X |
| 4,821,051 | 4/1989 | Hediger | 346/107 R X |
| 4,851,862 | 7/1989 | Newman et al. | 346/107 R |
| 4,916,464 | 4/1990 | Ito et al. | 346/107 R |
| 4,951,098 | 8/1990 | Albergo et al. | 346/107 R X |

*Primary Examiner*—Benjamin R. Fuller
*Assistant Examiner*—David Yockey
*Attorney, Agent, or Firm*—Norman Rushefsky

[57] ABSTRACT

An LED printhead that includes a plurality of LED chip arrays arranged in a row has areas adjacent end LEDs on each array connected by wires to provide a direct thermal shunt to reduce a temperature gradient between these LEDs.

8 Claims, 2 Drawing Sheets

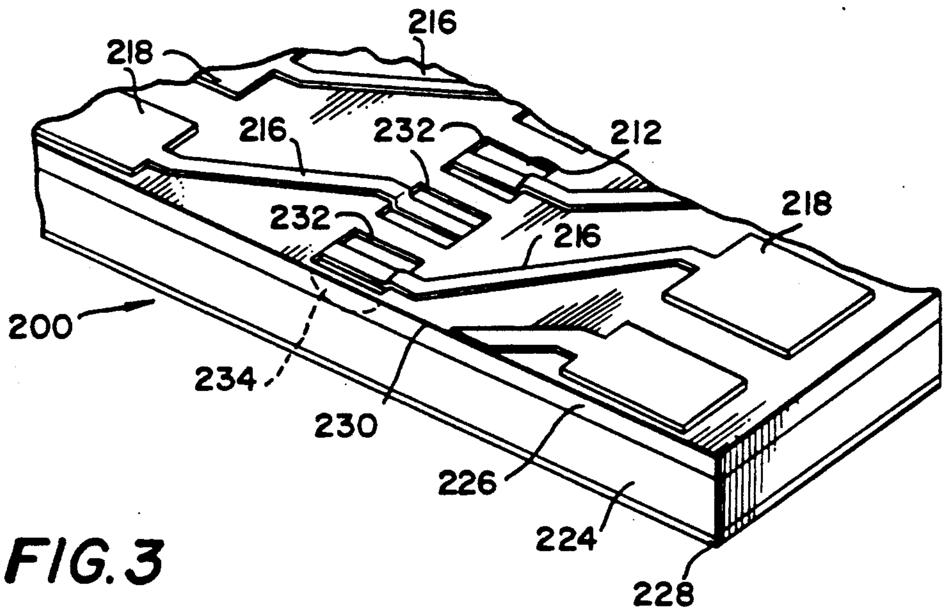
FIG. 3
PRIOR ART
FIG. 4
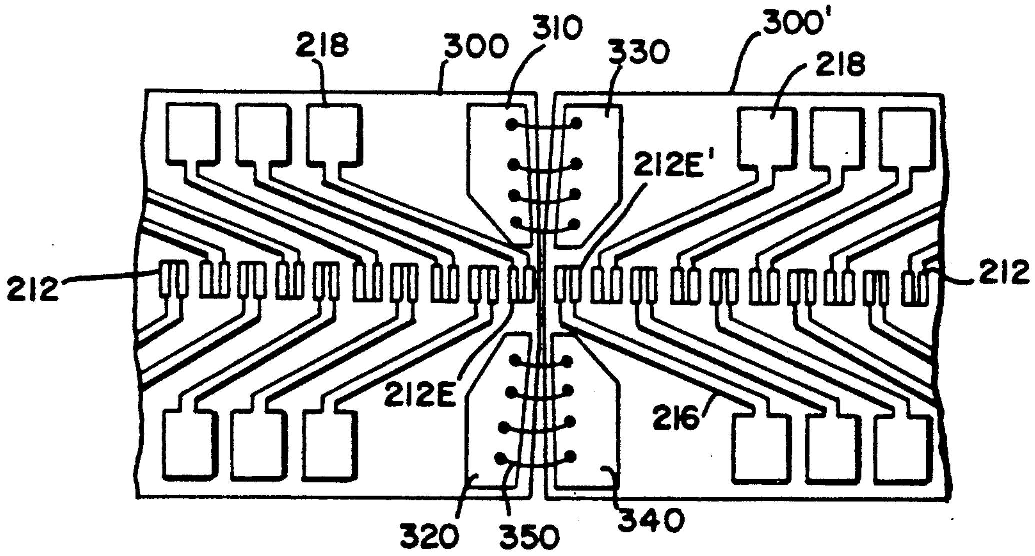

LED ARRAY PRINTHEAD WITH THERMALLY COUPLED ARRAYS

FIELD OF THE INVENTION

The invention relates to light-emitting diode (LED) array printheads and, more particularly, to improved means for compensating for temperature gradients between adjacent edge LEDs on abutting LED chip arrays.

DESCRIPTION OF THE PRIOR ART

Optical printheads are used in copiers, duplicators, and printers to expose a photoconductive member or photosensitive film in the apparatus in such a manner that a latent image is formed on the surface or film. In the case of electrophotographic reproduction apparatus, the latent image is later developed and transferred to paper for producing a hard copy output from the apparatus. Normally, optical printheads use light-emitting diodes (LEDs) to generate or produce the radiation necessary to expose the photoconductive member. In conventional printheads, the LEDs are arranged in a linear array of LEDs having a designed density to provide a resolution of a predetermined number of dots per inch. In other words, the greater the number of dots per inch desired to be printed, the greater will be the number of LEDs grouped together in a linear string. In high resolution printheads, the requirements for the spacing between the LEDs becomes critical.

In most cases, the LEDs are provided on separate chip assemblies with each chip having several LEDs, such as 128 per chip. Printheads having several thousand LEDs in a linear array, therefore, require many chips to construct such an array. Since any spacing between the chips which is greater than the spacing between the individual LED segments on each chip will produce undesirable prints or copies, it has been desirable, according to the prior art, to mount the chips as closely as possible to each other.

A typical LED array chip of the type to which the present invention relates comprises a plurality of uniformly-spaced light sources or light-emitting diode sites along the front face of a semiconductor chip. All of such sites are electrically grounded to a common conductive layer on the back face of the chip and each individual diode site is provided on the front face of the chip with its own individual electrode structure by which that site is connected to a control chip so that it can be selectively energized.

In an LED array printhead assembly, a plurality of LED array chips are mounted in an end-to-end relationship with each other on a support member to provide a continuous line of equally spaced diode sites long enough to traverse a standard size piece of paper. A typical LED array printhead of this type for standard DIN A4 paper would be about 8.5 inches (216 mm) long. The individual diode sites typically might be spaced at about 400 sites per inch (160 per centimeter), with each chip being somewhat less than 0.4 inches (10 mm) long.

In a very high quality LED printing system one has to consider some of the dynamic thermal affects upon the LEDs. This is a result of LEDs decreasing in brightness as the temperature of the array increases. Such decreases in brightness affect the quality of images produced by these optical printheads. While the prior art recognizes that temperature can be compensated for by adjustment of current and/or data to adjust pulsewidth, a problem arises where large temperature gradients exist on the printhead from LED to LED on the same chip array. Typically, each LED chip array or a group of say several LED chip arrays will be driven by one or two driver chips. It would facilitate the design of such driver chips if large disparities in driver requirements didn't exist from LED to LED.

It is therefore an object of the invention to reduce the disparity in temperature along an LED chip array or in other words to reduce the temperature gradient that may exist between LEDs on the same and adjacent arrays.

SUMMARY OF THE INVENTION

In accordance with the invention, there is provided an optical printhead that comprises a plurality of chip arrays arranged in a row on a support. Each chip array includes a plurality of light-emitting recording elements arranged in the row. A non-signal bearing thermally conductive wire connects areas adjacent two adjacent recording elements from different adjacent chip arrays to shunt heat energy from areas adjacent one recording element to areas adjacent the other recording element to reduce temperature disparities between the recording elements.

The invention and its benefits and advantages will become more apparent when considered in view of the following detailed description and drawings.

BRIEF DESCRIPTION OF THE DRAWINGS

FIG. 3 is a fragmentary plan view of an LED array chip of the prior art to illustrate a typical LED array configuration to help explain the improvement of my invention; and FIG. 4 is a fragmentary plan view of an adjacent butted pair of LED chip arrays and featuring the improved features of the invention.

DESCRIPTION OF THE PREFERRED EMBODIMENTS

Figure 1:
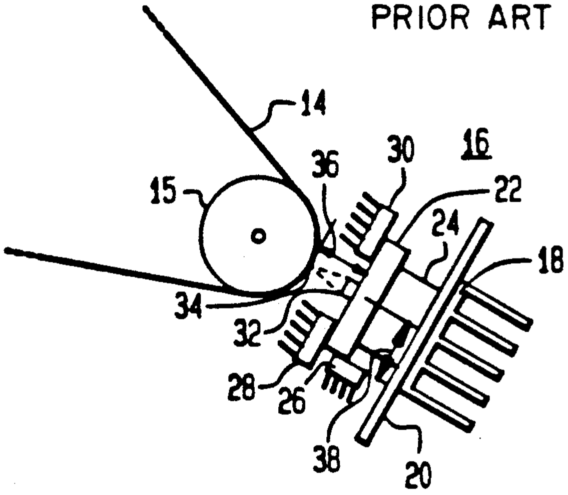
FIG. 1 PRIOR ART
FIG. 1 is a schematic view of a prior art printhead assembly showing its relationship to a photoconductive surface.

Throughout the following description, similar reference characters refer to similar elements or members in all of the figures of the drawing.

Referring now to the drawing, and to FIG. 1 in particular, there is shown a schematic view of a printhead constructed according to the prior art and its relationship to a photoconductive member which is exposed by the printhead. The photoconductive film or web 14 travels around the roller 15 and is selectively exposed by radiation from light-emitting diodes (LEDs) contained within the printhead 16. The control electronics for selectively activating the printhead LEDs in synchronization with the movement of the film 14 is not illustrated in FIG. 1. The printhead 16 includes a rigid heat-dissipating structure or heat sink device 18, the printed circuit board 20, the mounting and registration plate 22, and the supporting and enclosing structure 24.

The components of the printhead 16 are arranged such that the printhead contains in one package all of the critical and essential components for an operational printhead. Thus, the printhead 16 can be removed easily from one machine and replaced by another printhead without alignment and adjusting procedures being required. According to FIG. 1 the mounting and registration plate 22 provides the complete means for securing the total printhead in the associated machine or apparatus. Reference supports 26, 28 and 30 in the machine coincide with precise surfaces on the plate 22 to align the printhead with respect to the photoconductive film 14. Although shown in schematic form in FIG. 1, an actual machine would include other mechanical members or fasteners which would secure the plate 22 against the reference supports 26, 28 and 30. It can seen from FIG. 1 that the printhead 16 contains the necessary components and that these components are integrally connected to each other and aligned with respect to the plate 22. Not only does this permit quick and convenient removal and replacement of printheads in the associated apparatus, it also offers other advantages such as providing a totally enclosed printhead which keeps out contamination to the LEDs and the bonding wires associated therewith.

The lens 32 is securely fastened in the plate 22 at a predetermined position such that the radiation or light from the LEDs focuses at point 34 on the photoconductive film 14 when the printhead 16 is properly in position. When properly in position, the printhead is spaced a fixed dimension 36 from the photoconductive film 14 and is aligned in the other required direction by the fixed distance 38, which is also governed by the precise surfaces on the plate 22 and the support 26. Further details of the printhead 16 may be found in U.S. Pat. No. 4,821,051 the pertinent contents of which are incorporated herein. However, it is emphasized here that the printhead 16 is specifically constructed for easy and convenient removal and insertion into its associated apparatus without further adjustments being required.

As noted in the prior art, a backing plate 48 is provided with a plurality of LED circuit assemblies 50 (FIG. 2) adhered thereto. The number of LED circuit assemblies attached to the backing plate depends upon the number of LEDs desired in the printhead. For example, if the printhead is to provide 400 dots per inch resolution, there would be 400 separate LED regions per inch across the face of backing plate 48. In the preferred embodiment of this invention, each tile or LED circuit assembly would have 384 LEDs within a width of 0.960 inches. The overall length of the printhead depends upon the size of the film width which is to be exposed.

The tiles constituting the circuit assemblies are attached to the backing plate by a suitable adhesive, such as an epoxy resin, which has suitable bonding and heat conducting properties. Before bonding, the tiles are precisely aligned such that the LED chips on the circuits are aligned in a row or straight line across the entire printhead structure. Each circuit assembly 50 includes three LED chip arrays.

Figure 2:
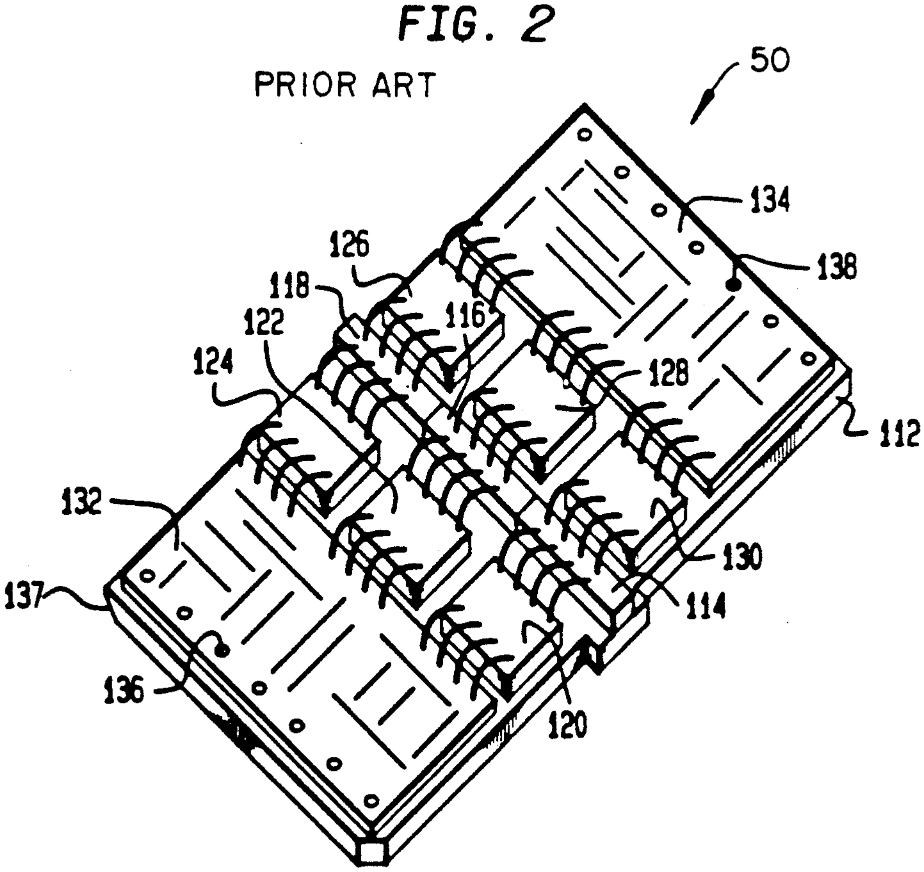
FIG. 2 PRIOR ART
FIG. 2 is a perspective view of a modular circuit tile used in the printhead of the prior art.

FIG. 2 is a perspective view of a modular circuit assembly, several of which are used in the printhead shown in FIG. 1. The circuit assembly includes the circuit substrate or mounting tile 112 to which the circuit elements and chips are bonded. For example, the LED chips 114, 116 and 118 along with the integrated circuit driver chips 120, 122, 124, 126, 128 and 130 are all attached to the ti)e 112. The circuit boards 132 and 134 are also attached to the tile 112. The circuit boards 132 and 134 are preferably constructed of a ceramic base material with a gold overlay circuit thereon and are bonded to the tile 112 by a suitable adhesive, such as an epoxy resin adhesive. The interconnecting wires shown in FIG. 2 are small aluminum wires bonded between the various circuit elements to complete the electrical connections therebetween. The circuit boards distribute signals and power to the driver chips which in turn use these signals to generate current to drive selected LEDs for recording.

As shown in FIG. 3, the illustrative LED chip array 200 comprises a substrate 224 made of N-type gallium arsenide (GaAs) on which is formed an N-type gallium epitaxial layer 226 of gallium arsenide phosphide (GaAsP). A common metallic electrode 228 is formed on the lower surface of substrate 224 and the upper surface of epitaxial layer 226 is provided with a thin mask layer 230 of silicone nitride, which is provided with windows 232 that define the sites of the individual light-emitting diodes 212. After the mask layer 232 has been applied to the epitaxial layer 226, suitable dopants are diffused into the epitaxial layer through windows 232 to define diffused regions, as shown at numeral 234. The boundary between each such region and the surrounding updoped epitaxial layer material provides a PN junction at which light is emitted.

The electrode structures 216, typically made of aluminum, are formed on the upper surface of the silicone nitride mask and may traverse windows 232 in contact with the upper face of the doped epitaxial layer so that each light-emitting diode can be energized by current flowing between a corresponding electrode pad structure 218 and the common electrode 228.

The foregoing description of the construction of the diode chip, per se, is simply illustrative and is typical of technology well known in the art, but the present invention is equally applicable to other types of diode array chips.

With reference now to FIG. 4, the improved LED chip array 300, 300' of the invention will be described with structure identified by the same numerals for that indicated for the prior art LED array being similar to that for the improved LED chip array of the invention. The improved LED chip array of the invention is similar to that described above but includes two aluminum pads at each end of each LED chip array with the two pads (310, 320; 330, 340) being provided so as to have each end LED (212E; 212E') being located between two of these pads. When the LEDs are assembled upon a tile, the ends of two respective LED chip arrays are thermally coupled to each other by wire bonds 350. In addition, after the tiles are mounted on the printhead, the end areas of LED chip arrays on adjacent tiles are similarly thermally coupled with wires.

Typically, the thermal connection between LED arrays is through the low thermally conductive gallium arsenide (GaAs) and epoxy layers of the LED chip array. Thus, if LEDs on an array are lighted up by current from the silicon driver chip the edge LEDs are often hotter than the LEDs in the center of the array, due to the inability of the heat energy to dissipate through less material or area available at the end of the LED chip array. The aluminum wirebonds for connecting the LEDs to the silicon driver chip array serve as a good conductor to reduce the temperature rise and the temperature differential between the LED array and the driver array. The aluminum wire bonds reduce the problem of low thermal conductivity by the epoxy layer between the GaAs array and its metallic substrate. It also appears that the aluminum metallization on top of the LED array also serves the function of spreading the heat on the LED chip array around and reducing the thermal gradient that causes optical gradients even after non-uniformity correction. A boundary thermal problem of an edge LED can cause a step function in exposure being produced by two adjacent end LEDs on butting adjacent LED chip arrays when a printing condition changes from say printing a bar—where one of the end LEDs is on for a long printing time but its adjacent LED is off for a this printing time—and then printing a flat field where both LEDs are now on. Therefore, it is desirable to have thermal communication between the LED arrays through a more conductive path than that provided by the GaAs and epoxy layers.

To reduce the discontinuity of the thermal condition path between LED arrays, the invention proposes that the good thermal conduction of aluminum wiring be utilized to join adjacent LEDs thermally with aluminum bond pads (310, 320; 330, 340) being provided at the edges of each LED chip array to facilitate the connection and provide additional thermal dissipation. These wires are not required for distributing any signals but serve merely as a thermal shunt of heat energy to reduce the temperature gradient between adjacent edge LEDs. In lieu of aluminum wire bonds, TAB (tape automated bonding) wires may be substituted to get thermal conduction between arrays. For a further description of TAB wires, reference is made to U.S. Pat. No. 4,851,862. Other good thermal conductive materials besides aluminum may be used such as gold, etc.. A typical thermal conductivity for aluminum is 135 Btu/hr. ft. °F. and is considered a good thermal conductor. Relatively poor thermal conductivity is provided by GaAs at about 26.6 Btu/hr. ft. F. The epoxy layer is even a worse thermal conductor than the gallium arsenide. Thus, by providing a higher level of conductivity between adjacent end LEDs on adjacent butting LED arrays, a reduced thermal gradient between these LEDs is provided thereby reducing edge boundary exposure artifacts resulting from thermal effects.

As used herein, the term "butting" implies close adjacentry and not necessarily touch contact. It is usually desirable to slightly space the LED chip arrays to preclude cracking due to thermal expansion of the chip arrays against each other.

Other recording elements to which the invention pertains are laser diodes. With regard to the first and last LEDs which are not adjacent another chip array, the wires may be connected to a pad on a circuit board for dissipating heat.

The invention has been described in detail with particular reference to preferred embodiments thereof, but it will be understood that variations and modifications can be effected within the spirit and scope of the invention.

I claim:

1. An optical recording printhead comprising:

a support;

a plurality of chip arrays arranged in a row on said support, each of the chip arrays including a plurality of uniformly spaced light-emitting diode recording elements arranged in a row, with one of the recording elements located adjacent one end of one of the chip having said uniform spacing from a second of the recording elements located adjacent an end of a second of the chip arrays that is adjacent to the one of the arrays chip; and means, including a plurality of non-signal bearing wires, for providing a direct thermal shunt of heat energy present at areas on a surface of the one of the chip arrays and adjacent said one of the recording elements to areas on a surface of the second of the chip arrays and adjacent said second of the recording elements.

2. The printhead of claim 1 and wherein the wires are connected to a metallized pad located on the surface of the one of the chip arrays adjacent said one of the recording elements and the wires are also connected to a metallized pad located on the surface of the second of the chip arrays adjacent said second of the recording elements.

3. The printhead of claim 2 and wherein the wires are tape-automated bonding wires.

4. The printhead of claim 1 and wherein the wires are tape automated bonding wires.

5. An optical printhead comprising:

a support;

a plurality of chip arrays arranged in a row on said support, each of the chip arrays including a plurality of light emitting diode recording elements arranged in said row; and thermal shunt means, including a non-signal bearing wire, for providing a direct thermal connection between a first area on a surface of the chip arrays which first area is adjacent a first of the light-emitting diode recording elements located on and adjacent an end of said one of the chip arrays, to a second area on a surface of a second of the chip arrays, which second area is adjacent a second of the light-emitting diode recording elements that is located on and adjacent an end of said second of the chip arrays and said second of the light-emitting diode recording elements is adjacent to the first of the light-emitting diode recording elements.

6. An optical printhead comprising:

a support;

a plurality of chip arrays arranged in a row on said support, each of the chip arrays including a plurality of light emitting recording elements arranged in the row; and a non-signal bearing thermally conductive wire connecting a first area on a surface of one of the chip arrays, which first area is adjacent a first of the light-emitting recording elements located on and adjacent an end of the one of the chip arrays, to a second area on a surface of a second of the chip arrays, which second area is adjacent a second of the light-emitting recording elements that is located adjacent an end of the second of the chip arrays and said second of the lightemitting recording elements is adjacent to said of the first light-emitting recording elements.

7. The printhead of claim 6 and wherein the recording elements are light-emitting diodes.

8. The printhead of claim 7 and wherein the wire is a tape automated bonding wire.

* * * * *